United States Patent
Karandikar et al.

(10) Patent No.: US 9,462,710 B2
(45) Date of Patent: Oct. 4, 2016

(54) PRESSURE RELIEF SYSTEM FOR SWITCHGEAR

(75) Inventors: Harshavardan M. Karandikar, Longwood, FL (US); Robert S. Karnbach, Lake Mary, FL (US); Rahul Pawar, Lake Mary, FL (US)

(73) Assignee: ABB SCHWEIZ AG, Zurich (CH)

( * ) Notice: Subject to any disclaimer, the term of this patent is extended or adjusted under 35 U.S.C. 154(b) by 525 days.

(21) Appl. No.: 13/885,426

(22) PCT Filed: Nov. 7, 2011

(86) PCT No.: PCT/US2011/059489
§ 371 (c)(1),
(2), (4) Date: Jun. 11, 2013

(87) PCT Pub. No.: WO2012/067861
PCT Pub. Date: May 24, 2012

(65) Prior Publication Data
US 2015/0036310 A1 Feb. 5, 2015

Related U.S. Application Data

(60) Provisional application No. 61/415,374, filed on Nov. 19, 2010.

(51) Int. Cl.
*H05K 5/00* (2006.01)
*H05K 5/02* (2006.01)
*H02B 13/025* (2006.01)

(52) U.S. Cl.
CPC .......... *H05K 5/0213* (2013.01); *H02B 13/025* (2013.01); *H05K 5/0217* (2013.01)

(58) Field of Classification Search
CPC .. H02B 1/56; H01H 2009/343; H01H 9/342; H05K 5/0247; H05K 7/20; H05K 7/142
See application file for complete search history.

(56) References Cited

U.S. PATENT DOCUMENTS

| 6,407,331 B1 | 6/2002 | Smith | |
|---|---|---|---|
| 2003/0117045 A1* | 6/2003 | Byron | H01H 31/12 312/199 |
| 2012/0097413 A1* | 4/2012 | Bugaris | H02B 13/025 174/50 |

FOREIGN PATENT DOCUMENTS

DE  1220925 B  7/1966

OTHER PUBLICATIONS

International Search Report and Written Opinion in PCT/US1/59489 dated Jan. 31, 2013.

*Primary Examiner* — Robert J Hoffberg
*Assistant Examiner* — Hung Dang
(74) *Attorney, Agent, or Firm* — Manelli Selter PLLC; Edward J. Stemberger

(57) ABSTRACT

A compartment of an arc resistant enclosure for an electrical component includes a plurality of wall structures defining an interior space for housing an electrical component. One of the wall structures has aperture structure for permitting pressure and gases to flow there-from and vent from the compartment. A stop structure is associated with the aperture structure. Flap structure is associated with the aperture structure and is movable from a closed position covering the aperture structure to an opened position extending outwardly of the compartment permitting pressure and gas to exit the compartment through the aperture structure. In the closed position, a portion of the flap structure engages the stop structure to prevent the flap structure from collapsing into the interior space of the compartment.

11 Claims, 5 Drawing Sheets

PRESSURE RELIEF SYSTEM FOR SWITCHGEAR

BACKGROUND OF THE INVENTION

The present invention relates to an electrical switchgear and, more particularly, to venting a compartment of an arc-resistant enclosure for a switchgear.

Arc-resistant switchgear must withstand high internal pressure due to expanding gasses generated by an internal arc fault. For example, FIG. 1 shows the pressure rise due to an arc fault inside a breaker compartment (dark line). Thus, mechanisms are provided in the switchgear for internal pressure relief. Such mechanisms guard against structural damage to the switchgear cubicle by preventing the pressure rise beyond a safe value. One such mechanism is to have a large opening that connects a circuit breaker compartment or voltage transformer compartment to a vent chamber, with normally closed vent flaps. The flaps open to let the arc gasses out of the compartment and into the vent chamber. The peak internal pressure is determined by how soon the vent flaps open.

The structure of the flaps is related to the type of the switchgear construction as defined in the arc-resistant testing standard IEEE C37.20.7, namely, whether the switchgear is Type 2, Type 2B or Type 2C. Type 2C construction implies that no arc gasses will penetrate a compartment other than the one where the arc fault is created. This is a technically challenging requirement to meet. When the arc gasses flow through the vent chamber to an exhaust plenum, the reverse pressure can collapse the vent flaps into an adjacent breaker compartment. Hence the flaps are structurally reinforced and are heavy. This flap configuration, however, leads to a higher value of peak pressure before the vent flaps open to exhaust the arc gasses. For example, FIG. 2 shows effect of having a heavy vent flap that opens and releases the pressure inside of a breaker compartment. The peak pressure in the compartment is reduced from about 900 psi to 700 psi based on the vent flap opening when the pressure reaches about 112 psi.

Thus, there is a need to provide an improved vent flaps for a compartment of switchgear enclosure that are lightweight to provide quick opening, yet do not collapse under pressure from outside of the compartment.

SUMMARY OF THE INVENTION

An objective of the present invention is to fulfill the need referred to above. In accordance with the principles of the invention, this objective is obtained by providing a compartment of an arc resistant enclosure for an electrical component. The compartment includes a plurality of wall structures defining an interior space for housing an electrical component. One of the wall structures has aperture structure for permitting pressure and gases to flow there-from and vent from the compartment. A stop structure is associated with the aperture structure. Flap structure is associated with the aperture structure and is movable from a closed position covering the aperture structure to an opened position extending outwardly of the compartment permitting pressure and gas to exit the compartment through the aperture structure. In the closed position, a portion of the flap structure engages the stop structure to prevent the flap structure from collapsing into the interior space of the compartment.

In accordance with another aspect of the invention, a method is provided for venting a compartment of an arc resistant enclosure. The method provides wall structure defining a compartment having an interior space for housing an electrical component. One of the wall structures has an aperture structure for permitting pressure and gases to flow there-from and vent from the compartment. Flap structure is associated with the aperture structure. The flap structure is permitted to move, as a result of pressure increase in the compartment, from a closed position covering the aperture structure to an opened position extending outwardly of the compartment permitting pressure and gas to exit the compartment through the aperture structure. In the closed position, the method ensures that the flap structure is mechanically prevented from collapsing into interior space of the compartment, due to backpressure being exerted on the flap structure.

Other objectives, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF AN EXAMPLE EMBODIMENT

Figure 1:
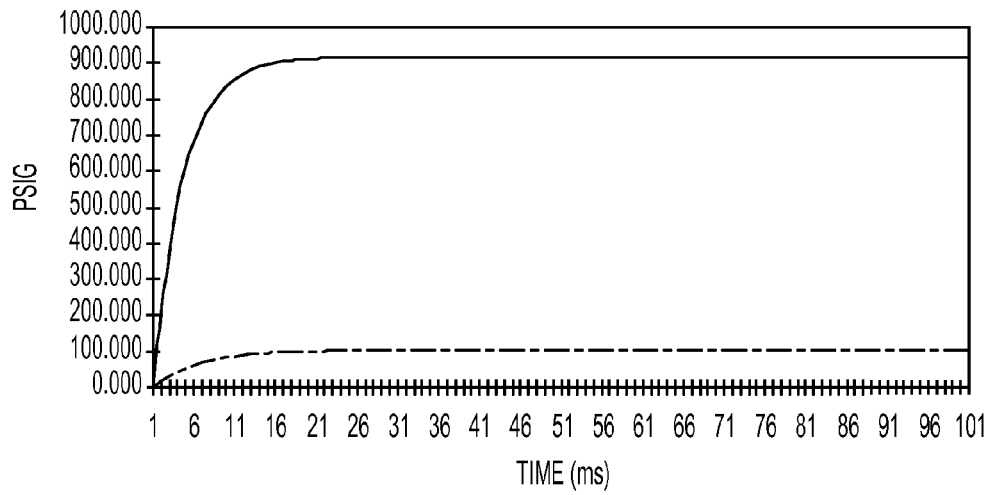
FIG. 1 is a graph showing the conventional pressure rise due to an arc fault inside a breaker compartment.
Figure 2:
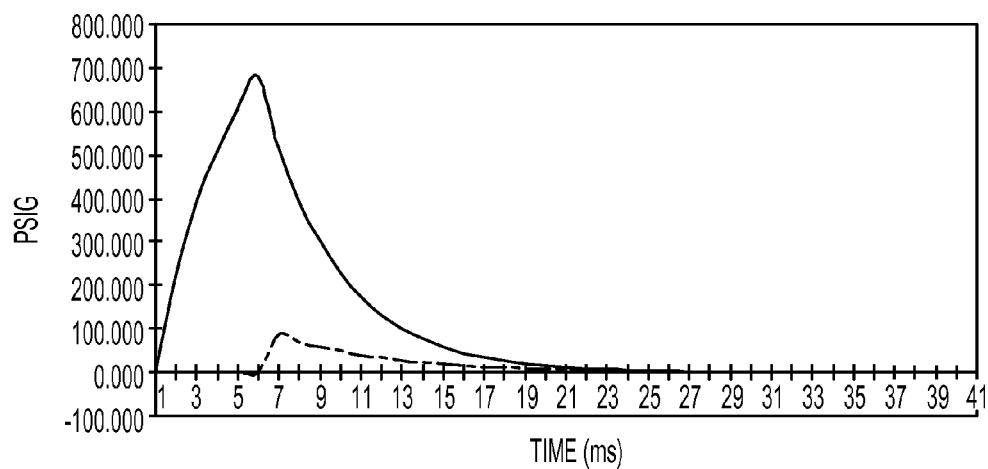
FIG. 2 is a graph showing the effect of having a conventional, heavy vent flap that opens and releases pressure inside a breaker compartment.
Figure 3:
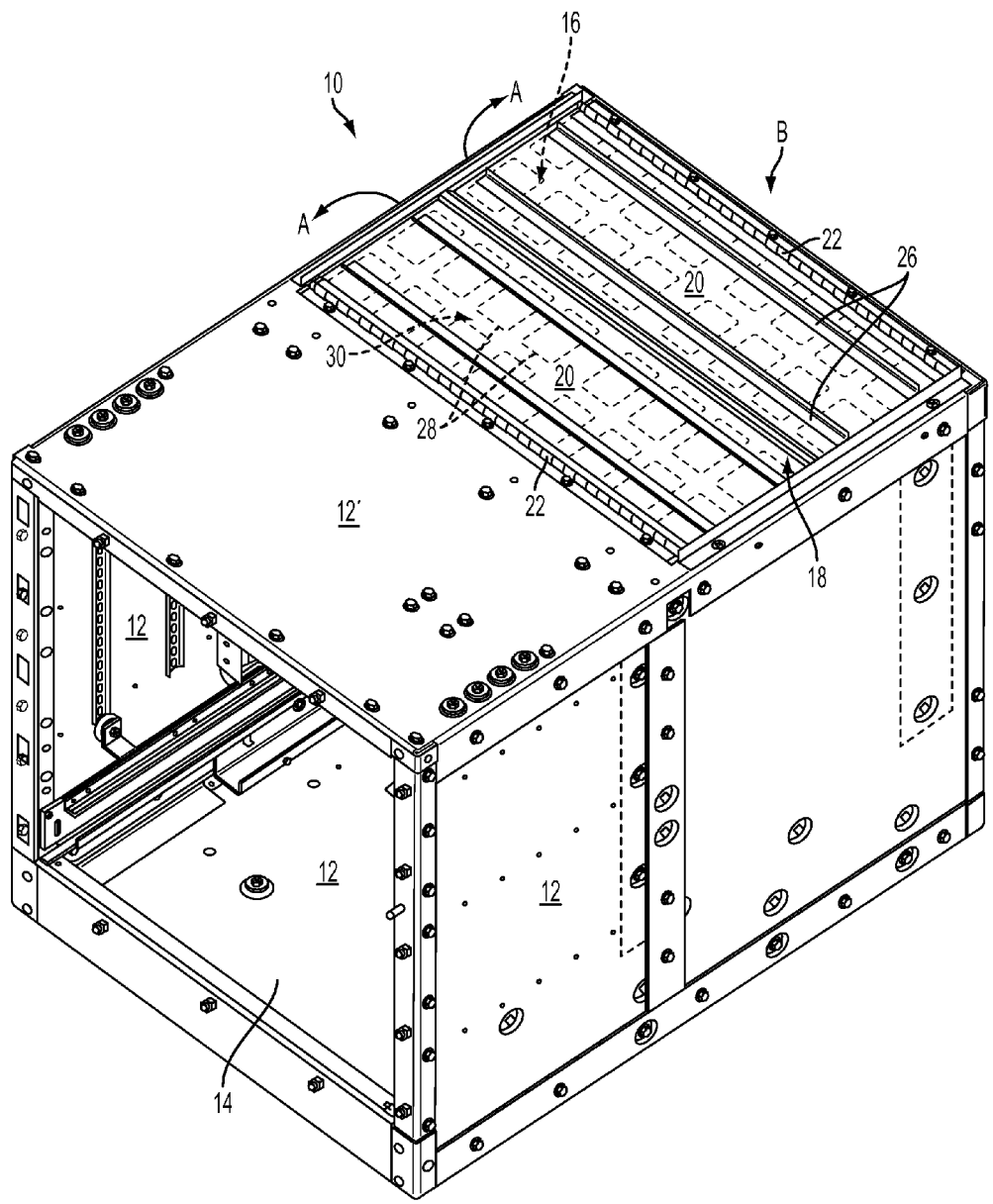
FIG. 3 is a perspective view of a breaker compartment of a switchgear enclosure having flap structure in accordance with an embodiment of the invention.

With reference to FIG. 3 a compartment of a switchgear enclosure is shown, generally indicated at 10, in accordance with an example embodiment. The compartment 10 can be part of a switchgear enclosure of the type disclosed in U.S. Pat. No. 5,689,097, the content of which is hereby incorporated by reference into this specification. The compartment 10 includes wall structure 12 defining a box-shaped enclosure having an interior space 14 for housing a conventional circuit breaker, such as a 1200 A breaker, or voltage transformer. The wall structures 12 of the compartment 10 and other portions of the enclosure are made of heavy gauge metal. Compartment 10 is typically positioned above an instrument compartment and an arch chamber and adjacent to a cable compartment and a bus compartment of the enclosure.

Since the area around interrupter assemblies (assembled or embedded poles) and a connection between the breaker contact arms and the primary bus is usually the hottest, a large aperture structure, generally indicated at 16, is provided at the top wall structure 12' of the breaker compartment 10, which is at the top of the switchgear enclosure. This aperture structure communicates with a vent chamber (not shown) in which the arc gasses enter in the event of an arc fault in a breaker compartment 10. This permits the pressure and hot gases to be released without the risk of injury to personnel who might be working near the switchgear. In the event of an arc fault in other compartments in a switchgear line-up (circuit breaker, main bus, etc.) this aperture structure 16 must be closed so as to prevent ingress of gasses.

Figure 4:
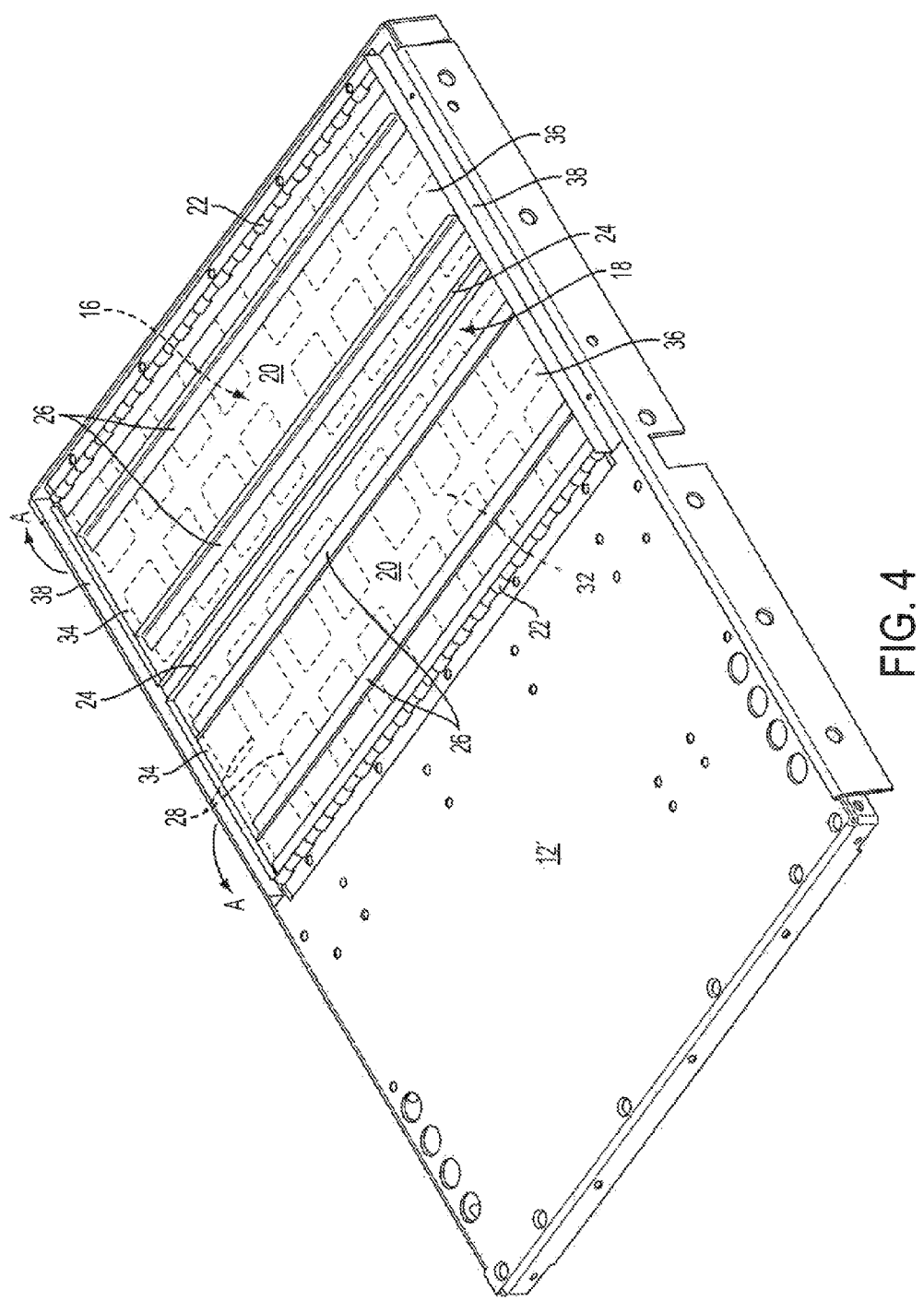
FIG. 4 is view of the top wall structure of the compartment of FIG. 3.
Figure 7:
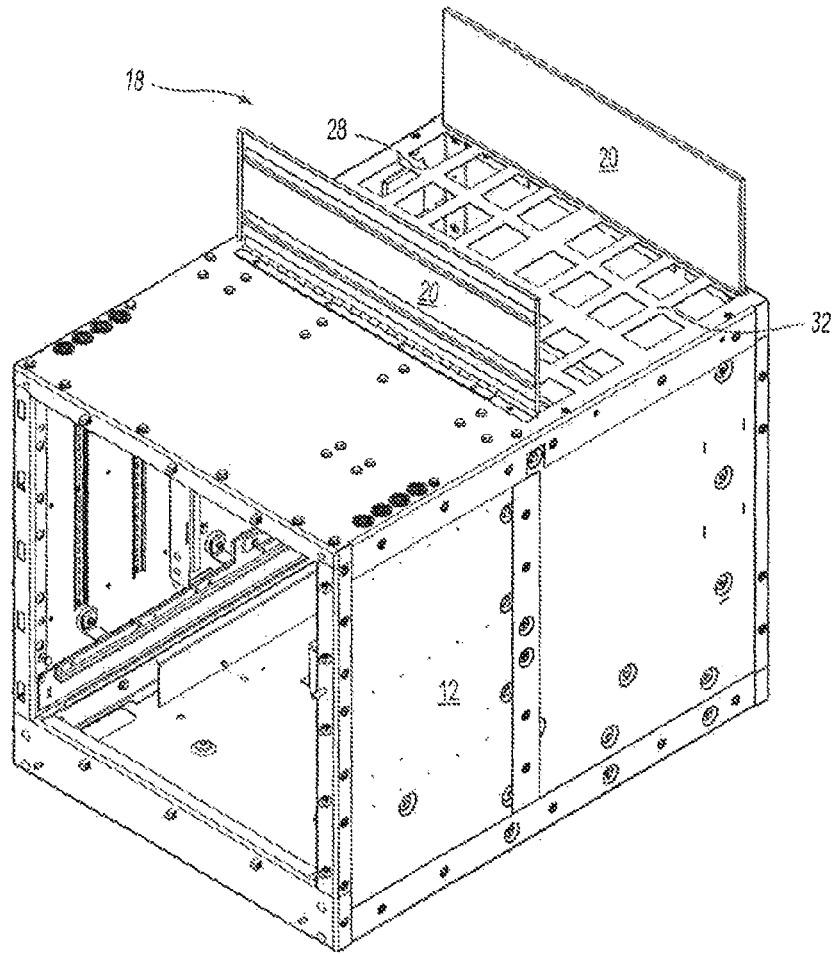
FIG. 7 is perspective view similar to that of FIG. 3, but shows the flap structure in an open position.

In accordance with an embodiment, the aperture structure 16 is closed via flap structure, generally indicated at 18. The top wall structure 12' is shown in FIG. 4 that includes the flap structure 18 mounted thereto. In the embodiment, the flap structure 18 includes a pair of flaps 20 that are normally disposed in a closed position to close the aperture structure 16 in the breaker compartment 10. Each flap 20 is of a gauge of metal that is greater than the gauge of metal of the wall structures 12, 12' so as to be thinner than the wall structures 12, 12'. Each flap 20 is connected at a side thereof to the top wall structure 12' by a hinge 22. The light, yet stiff flaps 20 can open quickly in the directions of arrows A, to due to pressure created by an arc fault in the interior 14, so as to exhaust the arc gasses into the vent chamber. Thus, with the lighter flaps 20 a lower peak pressure in the interior 14 of the breaker compartment 10 is ensured. In the opened position, the flaps 20 extend outwardly of the compartment 10, as shown in FIG. 7.

In the embodiment, the flap structure 18 is provided as a two piece butterfly flap configuration (rather than the conventional one-piece flap). This ensures that each flap 20 is of reduced weight and will open much faster than the conventional flap. Thus, the flaps 20 are generally planar, rectangular members having a free end 24 such that when moving towards the closed position, the free ends 24 move towards each other and generally abut near a center of the aperture structure 16 in the closed position thereof. When moving towards the opened position, the free ends 24 move away from each other.

Figure 5:
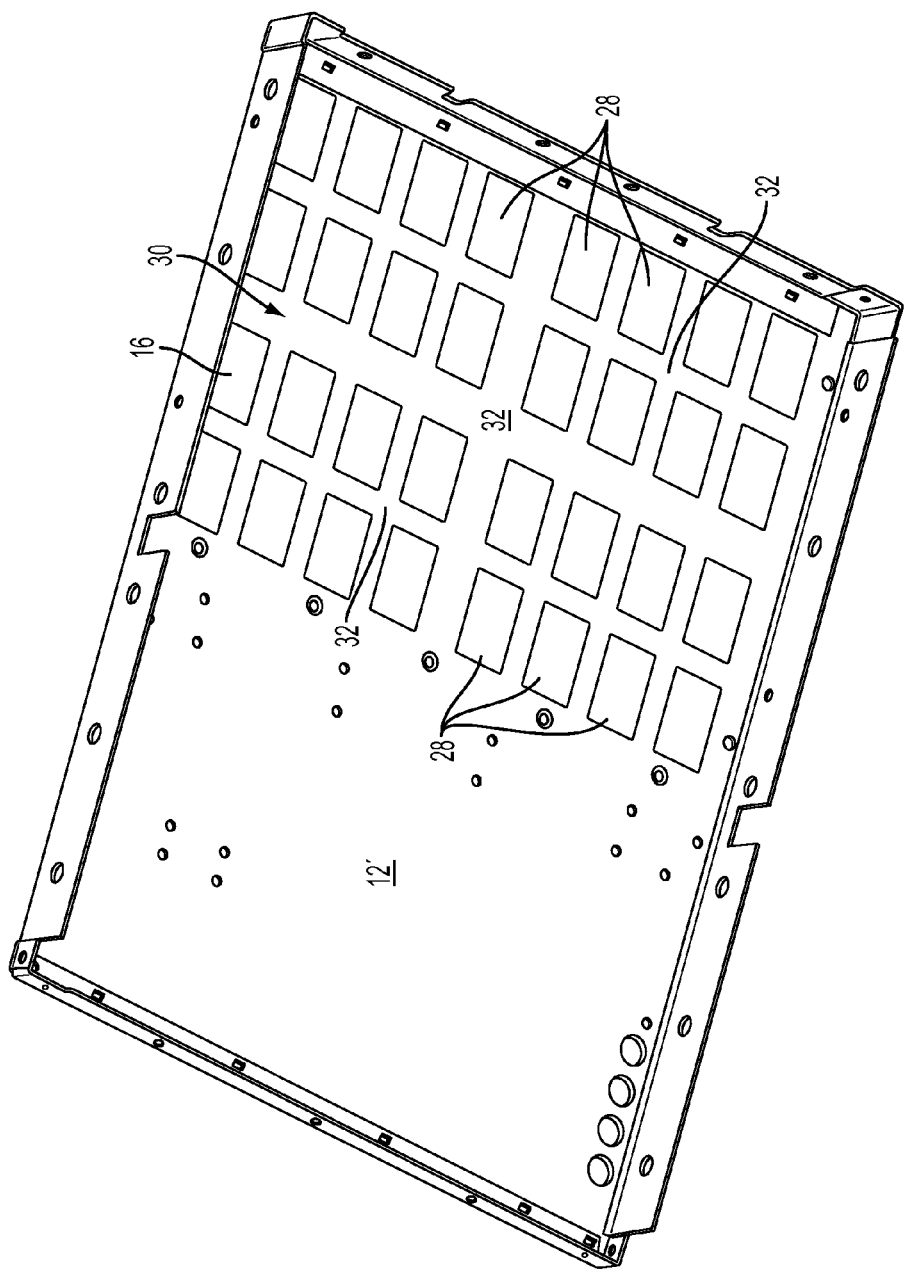
FIG. 5 is view of the top wall structure of the compartment of FIG. 4, but shown with the flap structure removed.

FIG. 5 shows the top wall structure 12' of the compartment 10 with the flaps 20 removed. In accordance with the embodiment, the aperture structure 16 is defined by a plurality of openings 28 in a stop or grate structure, generally indicated at 30, provided in the top wall structure 12'. Planar surfaces 32 of the grate structure 30 that define the openings 28 provide reinforcement to the flaps 20 in the closed position (FIG. 3) so that the flaps 20 rest on the grate structure surfaces 32 and do not collapse into the interior 14 of the breaker compartment 10 due to backpressure exerted thereon in the direction of arrow B (see FIG. 3).

As best shown in FIG. 4, the flaps 20 have opposing sides 34, 36. The compartment 10 includes generally L-shaped members 38 extending from the top wall structure 12' and adjacent to each of the sides 34, 36 of the flaps 20 for limiting or preventing gasses from getting under the flaps 20 in the closed position thereof. Furthermore, support members, preferably in the form of L-brackets 26, can be provided on a surface of each flap 20 between the sides 34, 36 to add rigidity to the flaps.

Figure 6:
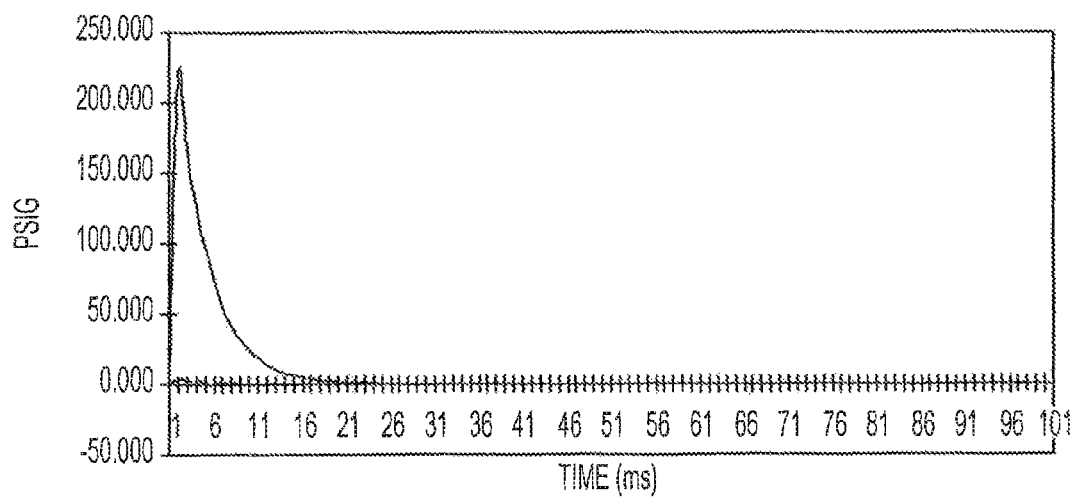
FIG. 6 is a graph showing that the very light vent flap structure of FIG. 1, will open quickly at lower pressure.

FIG. 6 shows the effect of having the very light vent flaps 20 that will open when the pressure reaches, for example, 32 psi. In this case, the peak pressure inside the enclosure is only about 200 psi.

The flap structure 18 with grate structure 30 enables a Type 2C arc-resistant certification of an enclosure and provides unidirectional strength and stiffness combined with a low manufacturing cost.

Rather than having the flat vent flaps 20, a convex flap or a flap with spherical indents can be provided in order to give the flap more stiffness against the gasses trying to come into the breaker compartment 10.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A compartment of an arc resistant enclosure for an electrical component comprising:
    a plurality of wall structures defining an interior space for housing an electrical component, one of the wall structures having aperture structure for permitting internal pressure and gasses to flow there-from and vent from the compartment;
    a stop structure associated with the aperture structure; and
    flap structure associated with the aperture structure and movable from a closed position covering the aperture structure to an opened position extending outwardly of the compartment permitting the internal pressure and gasses to exit the compartment through the aperture structure,
    wherein, in the closed position, a portion of the flap structure engages the stop structure to prevent the flap structure from collapsing into the interior space of the compartment,
    wherein the flap structure includes a pair of flaps, each flap being hinged to the compartment at one end thereof and each flap having a free end such that when moving towards the closed position, the free ends move towards each other and generally abut near a center of the aperture structure in the closed position thereof, and when moving towards the opened position, the free ends move away from each other, and
    wherein the flaps have opposing openable sides, and the compartment further comprises members having portions extending outwardly and transversely from the one wall structure and adjacent to each of the openable sides of the flaps for preventing external gasses from getting under the openable sides in the closed position of the flaps.

2. The compartment of claim 1, wherein the members are L-shaped with each L-shaped member including a first leg coupled to the one wall and a second leg extending transversely with respect to the first leg, the legs defining the portions extending outwardly and transversely from the one wall structure and adjacent to each of the sides of the flaps.

3. The compartment of claim 1, in combination with the electrical component.

4. The compartment of claim 3, wherein the electrical component is a switchgear component.

5. The compartment of claim 1, wherein each flap includes a support member extending between the sides.

6. The compartment of claim 5, wherein the support member is an L-shaped bracket.

7. A method of venting a compartment of an arc resistant enclosure, the method comprising the step of:
    providing wall structure defining a compartment having an interior space for housing an electrical component, one of the wall structures having an aperture structure for permitting internal pressure and gasses to flow there-from and vent from the compartment;

associating flap structure with the aperture structure;

permitting the flap structure to move, as a result of pressure increase in the compartment, from a closed position covering the aperture structure to an opened position extending outwardly of the compartment permitting the internal pressure and gasses to exit the compartment through the aperture structure;

in the closed position, mechanically preventing the flap structure from collapsing into interior space of the compartment, due to backpressure being exerted on the flap structure, and in the closed position, preventing external gasses from getting under openable sides of the flap structure by providing members having portions that extend outwardly and transversely from the one wall and adjacent to the openable sides of the flap structure, wherein the steps of providing the wall structure and the flap structure include providing the wall structure from metal of a certain gauge and providing the flap structure from metal having a gauge greater than the certain gauge.

8. The method of claim 7, wherein the step of preventing the flap structure from collapsing into interior space of the compartment includes providing a grate structure having surfaces defining a plurality of openings that define the aperture structure, such that in the closed position, the flap structure engages the surfaces of the grate structure.

9. The method of claim 7, wherein step of providing the flap structure includes providing a pair of flaps, each flap being hinged to the one wall structure at one end thereof and each flap having a free end such that when moving towards the closed position, the free ends move towards each other and generally abut near a center of the aperture structure in the closed position thereof, and when moving towards the opened position, the free ends move away from each other.

10. The method of claim 7, wherein the step of providing members includes providing L-shaped members each including a first leg coupled to the one wall and a second leg extending transversely with respect to the first leg, the second legs defining the portions extending outwardly and transversely from the one wall structure and adjacent to the sides of the flap structure.

11. The compartment of claim 1, wherein the wall structures are defined by metal of a certain gauge and the flap structure is defined by metal having a gauge greater than the certain gauge.

* * * * *